(12) United States Patent
Chou et al.

(10) Patent No.: US 12,094,922 B2
(45) Date of Patent: Sep. 17, 2024

(54) INDUCTANCE TRACES PROTECTED THROUGH SHIELDING LAYERS

(71) Applicant: PHOENIX PIONEER TECHNOLOGY CO., LTD., Hsinchu County (TW)

(72) Inventors: Pao-Hung Chou, Hsinchu County (TW); Chun-Hsien Yu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 315 days.

(21) Appl. No.: 17/686,744

(22) Filed: Mar. 4, 2022

(65) Prior Publication Data
US 2022/0328613 A1 Oct. 13, 2022

(30) Foreign Application Priority Data
Apr. 8, 2021 (TW) .................................. 110112773

(51) Int. Cl.
| H01L 23/64 | (2006.01) |
| H01L 23/498 | (2006.01) |
| H01L 23/552 | (2006.01) |
| H01L 49/02 | (2006.01) |

(52) U.S. Cl.
CPC ........ H01L 28/10 (2013.01); H01L 23/49822 (2013.01); H01L 23/49838 (2013.01); H01L 23/552 (2013.01); H01L 23/645 (2013.01)

(58) Field of Classification Search
CPC ..... H01L 28/10; H01L 23/645; H01L 23/552; H01L 2924/3025; H01F 17/0013; H01F 2027/2809; H01F 2017/0073
USPC ......................................................... 257/322
See application file for complete search history.

(56) References Cited

U.S. PATENT DOCUMENTS

| 2006/0157798 A1* | 7/2006 | Hayashi ................ H01L 23/552 257/E29.022 |
| 2011/0235302 A1* | 9/2011 | Hijioka ............... H01L 23/5227 361/811 |
| 2020/0027637 A1* | 1/2020 | Sano .................... H01F 17/0013 |
| 2021/0125770 A1* | 4/2021 | Yoshioka ............... H05K 1/165 |
| 2022/0320004 A1* | 10/2022 | Chang ................... H01F 27/363 |

* cited by examiner

*Primary Examiner* — Didarul A Mazumder
(74) *Attorney, Agent, or Firm* — Amin, Turocy & Watson, LLP

(57) ABSTRACT

An inductance structure is provided and includes a plurality of inductance traces embedded in an insulating body and at least one shielding layer that is embedded in the insulating body and free from being electrically connected to the inductance traces. The shielding layer has a plurality of line segments that are free from being connected to one another. The shielding layer shields the inductance traces to improve the inductance value and quality factor.

16 Claims, 15 Drawing Sheets

INDUCTANCE TRACES PROTECTED THROUGH SHIELDING LAYERS

CROSS-REFERENCE TO RELATED APPLICATIONS

This application claims priority to Taiwan Application Serial No. 110112773, filed on Apr. 8, 2021. The entirety of the above-mentioned patent application is hereby incorporated by reference herein and made a part of this specification.

BACKGROUND

1. Technical Field

The present disclosure relates to inductance structures, and more particularly, to a spiral coil type inductance structure of a substrate-based inductor embedded in a packaging substrate.

2. Description of Related Art

In general semiconductor application devices such as communication or high-frequency semiconductor devices, radio-frequency (RF) passive elements such as resistors, inductors, capacitors and oscillators are electrically connected to packaged semiconductor chips so as to cause the semiconductor chips to have certain electric current characteristics or send signals. For example, there are various types of conventional inductors for various applications such as filters, chokes, DC-DC converters and so on, and have various advantages and drawbacks.

For example, spiral inductors are often used in devices with RF modules. Under the requirements of high-density and miniaturization of the RF modules, the distance between elements is reduced and electromagnetic interference (EMI) easily occurs between the elements. Therefore, there is a need to overcome the electromagnetic interference between the elements and provide minimized inductors with preferred magnetic shielding and anti-EMI performance.

Further, when spiral inductors are used in high frequency applications, there is a need to provide lower magnetic loss and eddy current effect and higher inductance value so as to obtain a better Q value and thereby reduce power consumption and improve electrical performance.

To overcome the above-described drawbacks, referring to FIG. 1, Taiwan Patent No. 1611439 uses a magnetic covering element 130, 132, 134 to provide magnetic shielding and anti-EMI capability. However, magnetic permeability of magnetic powder mixed with an insulating material is relatively lower than that of the original magnetic powder, thus limiting the improvement of the inductance value and the magnetic shielding and anti-EMI capability.

Further, the magnetic powder mixed with the insulating material has poor uniformity, making it difficult to control magnetic conductivity. Furthermore, after a substrate is formed by molding the mixture with the magnetic powder, due to its material property, a circuit patterning process is not suitable. Therefore, additional circuits cannot be formed on the dielectric layer or the magnetic covering element.

In addition, referring to FIG. 1, a coil element 100 of Taiwan Patent No. 1611439 is formed by injection molding, transfer molding or low-temperature co-firing, thus resulting in poor processability. Therefore, it is only suitable for small-area processing instead of mass production. As such, the processing cost of the inductor remains high, and the geometric accuracy of the coil element is poor, resulting in poor accuracy (or tolerance) of the inductance value.

Therefore, how to overcome the above-described drawbacks of the prior art has become an urgent issue in the art.

SUMMARY

In view of the above-described drawbacks of the prior art, the present disclosure provides an inductance structure, which comprises: an insulating body having opposite first and second sides; a plurality of spiral inductance traces stacked in layers with inter-layer spacing and embedded in the insulating body; at least one electrical conductor embedded in the insulating body and connecting two adjacent stacked spiral inductance traces; and a plurality of shielding layers embedded in the first and second sides of the insulating body for shielding the spiral inductance traces, wherein the plurality of shielding layers are free from being electrically connected to the spiral inductance traces, and wherein the plurality of shielding layers comprise a plurality of line segments that are free from being connected to one another.

In the aforementioned inductance structure, the insulating body comprises Ajinomoto build-up film, polyimide or epoxy molding compound.

The aforementioned inductance structure further comprises at least one electrically conductive post embedded in the insulating body and electrically connected to an end of at least one of the spiral inductance traces. Further, the aforementioned inductance structure comprises at least one electrically conductive pad formed on the first or second side of the insulating body, wherein the electrically conductive pad is electrically connected to the electrically conductive post and exposed from the insulating body. Furthermore, a cross-sectional shape and an area of the electrically conductive post correspond to a cross-sectional shape and an area of the electrically conductive pad.

In the aforementioned inductance structure, a shape of the electrical conductor corresponds to shapes of the spiral inductance traces, wherein the shape of the electrical conductor is an arc-shaped sheet body or an arc-shaped wall body.

In the aforementioned inductance structure, two adjacent spiral inductance traces have the same or different rotation directions.

In the aforementioned inductance structure, the plurality of line segments of the shielding layers are arranged in a radial, multi-ring or parallel straight line pattern with a circular or polygonal outline.

In the aforementioned inductance structure, the shielding layers comprise a magnetic conductive material or a non-magnetic metal.

The aforementioned inductance structure further comprises a magnetic conductive layer formed on portions of surfaces of the shielding layers, wherein the magnetic conductive layer is made of a magnetic conductive material, and the shielding layers are made of a non-magnetic metal.

The aforementioned inductance structure further comprises a core body embedded in the insulating body and surrounded by the spiral inductance traces. For example, the core body comprises at least one annular electrically conductive post or a solid electrically conductive post. Further, the core body comprises a magnetic conductive material or a non-magnetic metal. Furthermore, the aforementioned inductance structure further comprises a magnetic conductive layer formed on portions of surfaces of the core body, wherein the magnetic conductive layer is made of a magnetic conductive material, and the core body is made of a non-magnetic metal. In addition, the aforementioned inductance structure further comprises a shielding member embedded in the insulating body for surrounding the spiral inductance traces, wherein the shielding member comprises a plurality of arc-shaped sheet bodies or arc-shaped wall bodies that are arranged in a ring shape. In addition, the shielding member comprises a magnetic conductive material or a non-magnetic metal. Alternatively, the aforementioned inductance structure further comprises a magnetic conductive layer formed on portions of surfaces of the shielding member, wherein the magnetic conductive layer is made of a magnetic conductive material, and the shielding member is made of a non-magnetic metal.

In the aforementioned inductance structure, the magnetic conductive material is at least one of Fe, Ni, Co, Mn and Zn, or a combination thereof.

According to the inductance structure of the present disclosure, the shielding layer covers the inductance traces so as to improve the inductance value and quality factor. Compared with the prior art, the present disclosure meets the requirements without using the conventional mixture of magnetic conductive elements and magnetic powders, thereby overcoming the conventional drawbacks.

BRIEF DESCRIPTION OF THE DRAWINGS

FIG. 2D-1 is a schematic upper plan view of a shielding layer of FIG. 2A.

FIGS. 2D-2 to 2D-6 are schematic upper plan views showing other aspects of FIG. 2D-1.

FIG. 3B-1 is a schematic upper plan view of a coil of an inductance trace of FIG. 3A.

FIG. 3B-2 is a schematic upper plan view of another coil of said inductance trace of FIG. 3A.

FIG. 3B-3 is a schematic upper plan view of a coil of another inductance trace of FIG. 3A.

FIG. 3B-4 is a schematic upper plan view of another coil of said another inductance trace of FIG. 3A.

FIG. 3C-1 is a schematic upper plan view of a shielding layer of FIG. 3A.

FIG. 3C-2 is a schematic upper plan view of another shielding layer of FIG. 3A.

DETAILED DESCRIPTION OF THE EMBODIMENTS

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

Figure 2A:
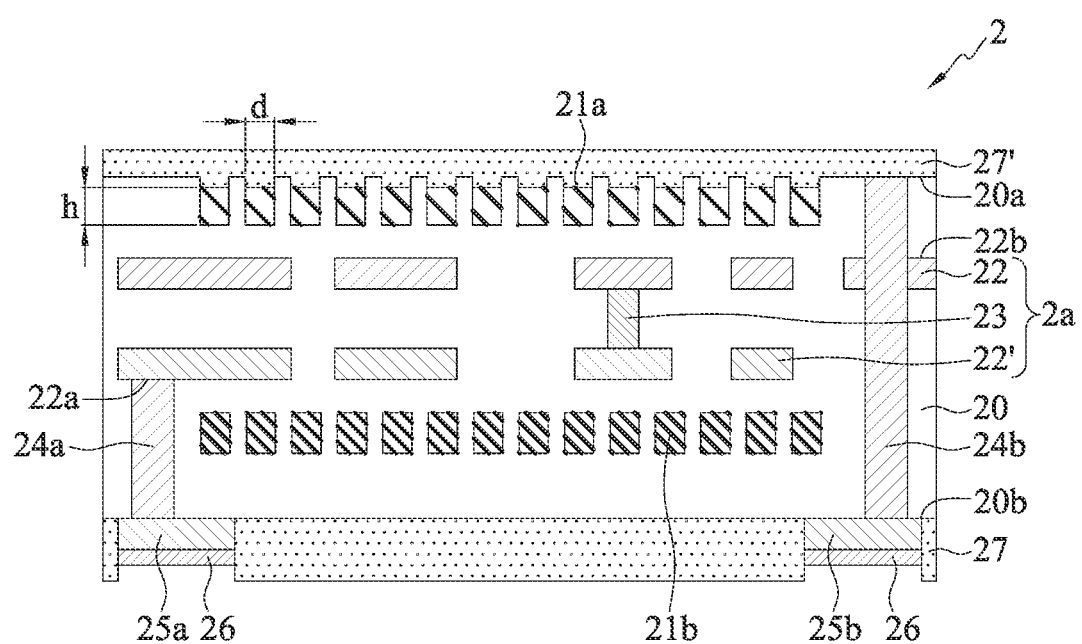
FIG. 2A is a schematic cross-sectional view of an inductance structure according to a first embodiment of the present disclosure.

FIG. 2A is a schematic cross-sectional view of an inductance structure 2 according to a first embodiment of the present disclosure. Referring to FIG. 2A, the inductance structure 2 has an insulating body 20, and an inductance body 2a and at least a shielding layer 21a, 21b embedded in the insulating body 20. The inductance body 2a has multi-layers (e.g., two layers) of inductance traces 22, 22' and at least an electrical conductor 23.

The insulating body 20 has a first side 20a and a second side 20b opposite to the first side 20a. In an embodiment, the insulating body 20 is made of a dielectric material such as Ajinomoto build-up film (ABF), photosensitive resin, polyimide (PI), bismaleimide triazine (BT), flame retardant 5 prepreg (FR5 PP), molding compound, epoxy molding compound (EMC) or the like. Preferably, the insulating body 20 is made of PI, ABF or EMC that facilitates circuit processing.

Figure 2B:
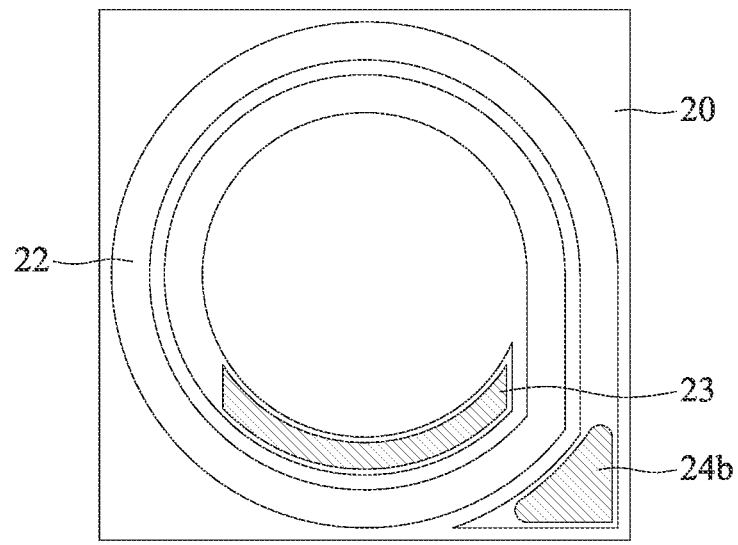
FIG. 2B is a schematic upper plan view of an inductance trace of FIG. 2A.
Figure 2C:
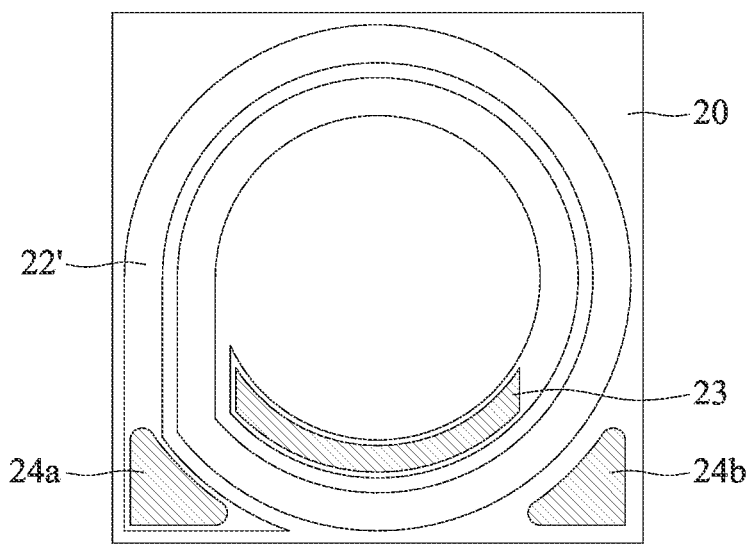
FIG. 2C is a schematic upper plan view of another inductance trace of FIG. 2A.

The inductance traces 22, 22' are single copper spiral coil, and the number of turns of the single spiral coil can be designed according to needs. For example, two turns are shown in FIGS. 2B and 2C.

In an embodiment, two contacts 22a, 22b of the inductance body 2a are positioned at outer ends of the two inductance traces 22, 22', respectively, so as to serve as input and output ports. For example, a first electrically conductive post 24a and a second electrically conductive post 24b are embedded in the insulating body 20. The first electrically conductive post 24a connects the second side 20b of the insulating body 20, the inductance trace 22' and the contact 22a, and the second electrically conductive post 24b connects the first side 20a and the second side 20b of the insulating body 20, the inductance trace 22 and the contact 22b.

Further, an end surface of the first electrically conductive post 24a is connected to a first electrically conductive pad 25a arranged on the second side 20b of the insulating body 20, and an end surface of the second electrically conductive post 24b is connected to a second electrically conductive pad 25b arranged on the second side 20b of the insulating body 20. Furthermore, the first and second electrically conductive pads 25a, 25b can be connected to other electronic elements. The first and second electrically conductive pads 25a, 25b can be arranged on one side (as shown in FIG. 2A) or both sides (not shown) of the insulating body 20. For example, referring to FIGS. 2B and 2C, the first electrically conductive post 24a and the second electrically conductive post 24b are solid irregular posts so as to contact more area of the first and second electrically conductive pads 25a, 25b, thereby obtaining a maximum conductive area.

Furthermore, a surface processing layer 26 can be formed on the first and second electrically conductive pads 25a, 25b to facilitate mounting of other electronic elements. The surface processing layer 26 can be made of Ni/Au, Ni/Pd/Au, solder or organic solderability preservative (OSP). For example, an insulating protective layer 27 can be formed on the second side 20b of the insulating body 20, and the first and second electrically conductive pads 25a, 25b or the surface processing layer 26 thereon can be exposed from the insulating protective layer 27. The insulating protective layer 27 can be made of a dielectric material, or a photosensitive or non-photosensitive organic insulating material, such as solder mask, ABF and EMC. In an embodiment, the insulating protective layer 27 and the insulating body 20 (even an insulating protective layer 27' to be described later) can be made of the same material, and the material combination can be simplified. It should be understood that the insulating protective layer 27 and the insulating body 20 (even the insulating protective layer 27' to be described later) can also be made of different materials.

The electrical conductor 23 is stacked with the inductance traces 22, 22' and disposed between the inductance traces 22, 22' so as for the inductance body 2a to be in the shape of a longitudinal annular three-dimensional spiral coil.

In an embodiment, the electrical conductor 23 corresponds in shape to the inductance traces 22, 22'. For example, referring to FIGS. 2B and 2C, the electrical conductor 23 is an arc-shaped sheet body or an arc-shaped wall body. Compared with the conventional electrically conductive vias or through holes formed by laser, the electrical conductor 23 can contact a larger area of the two inductance traces 22, 22'.

Figure 1:
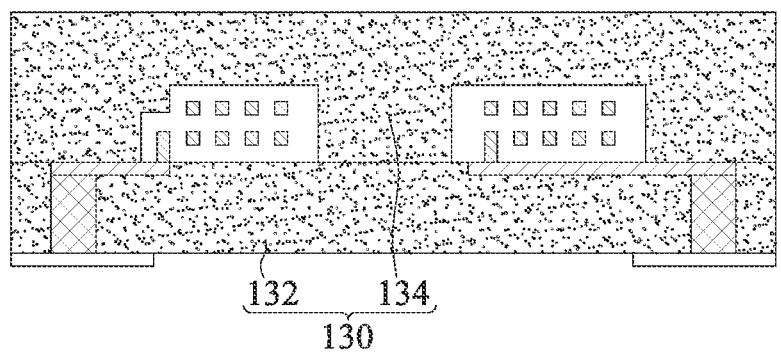
FIG. 1 is a schematic cross-sectional view of a conventional packaging substrate.
Figures 1, 2D:
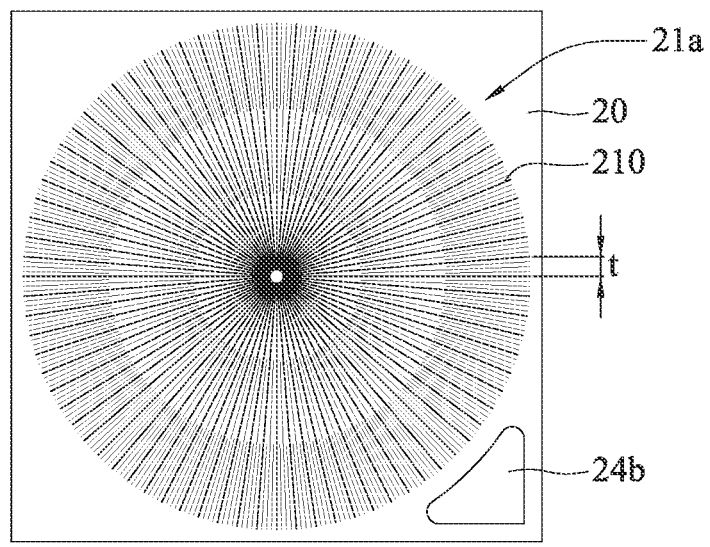
Figures 2, 2D:
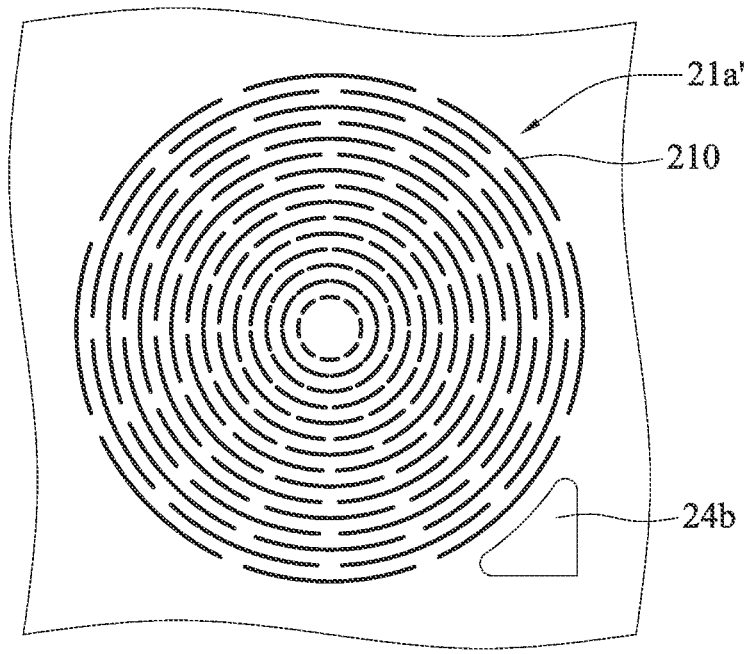
Figures 2, 2D, 3:
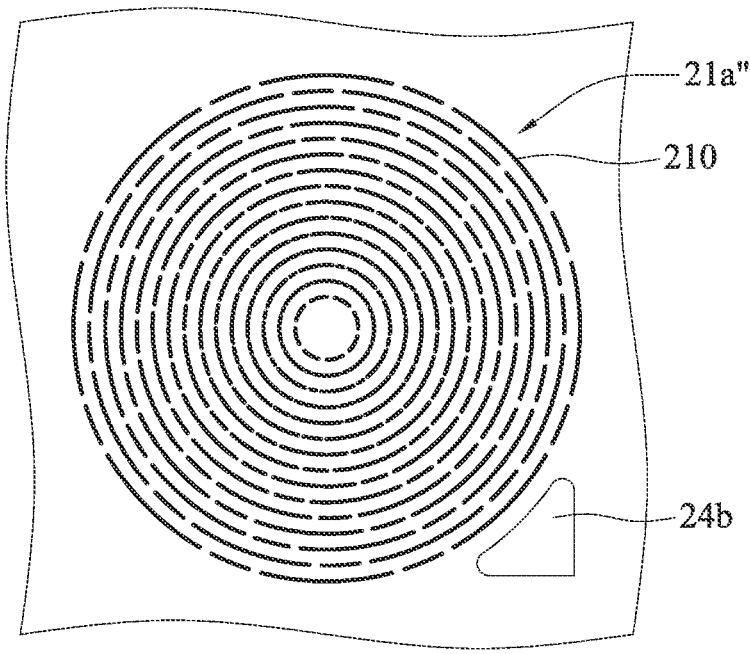
Figures 2, 2D, 3, 4:
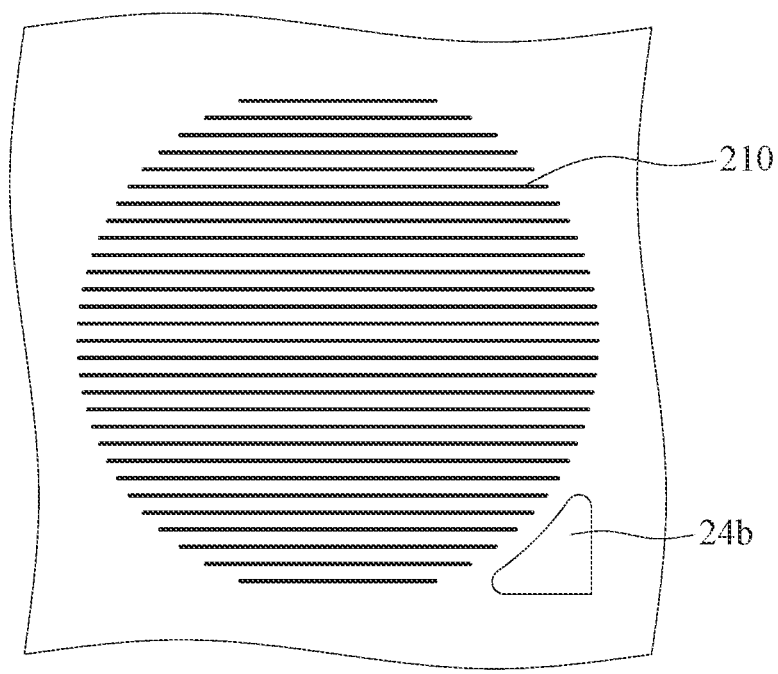
Figures 2, 2D, 3, 4, 5:
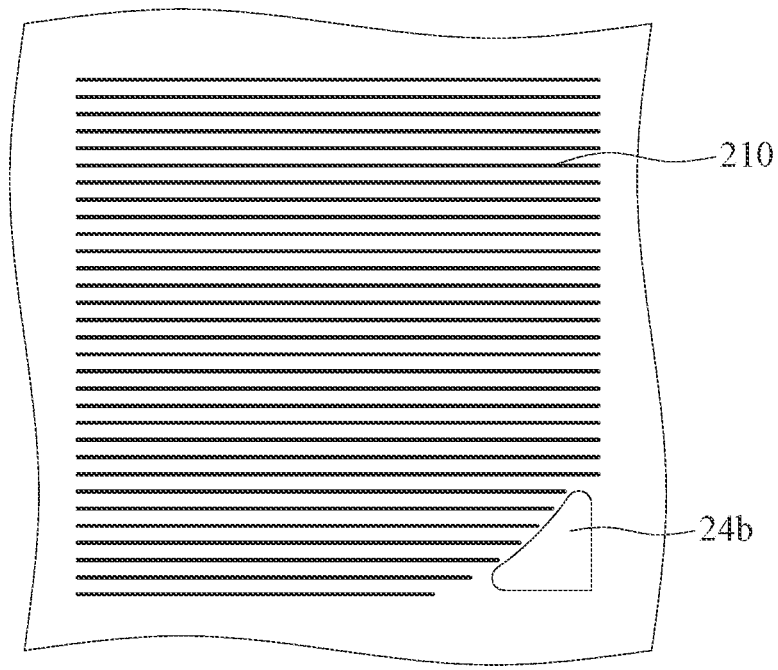
Figures 2, 2D, 3, 4, 5, 6:
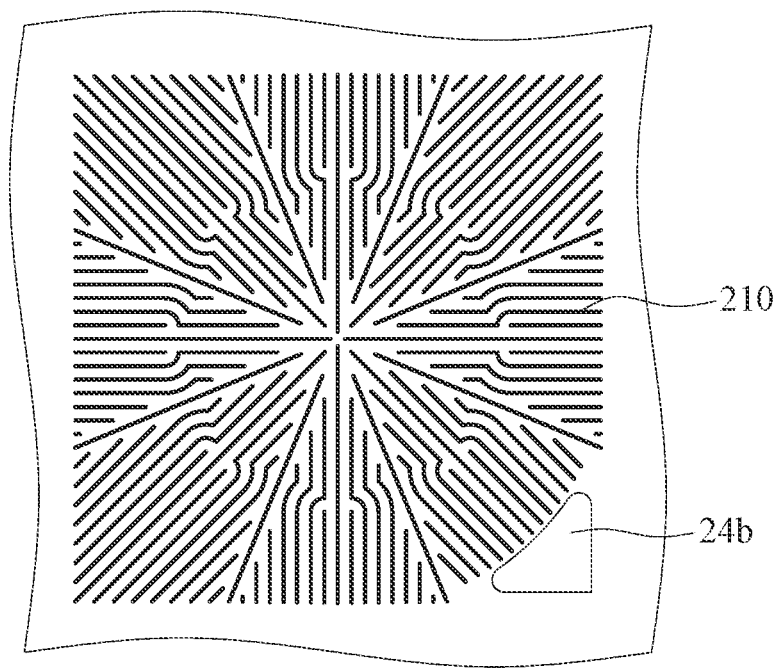
Figure 2E:
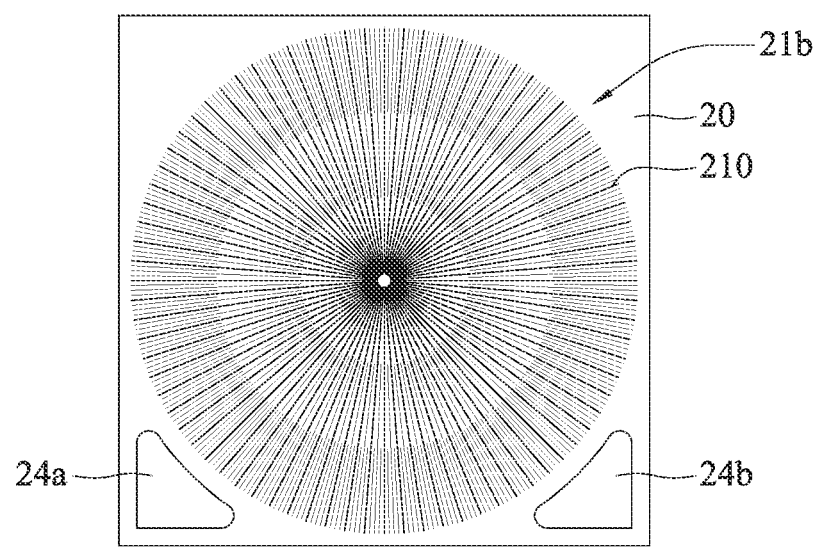
FIG. 2E is a schematic upper plan view of another shielding layer of FIG. 2A.

The shielding layers 21a, 21b are embedded in the first side 20a and the second side 20b of the insulating body 20 and arranged on upper and lower sides of the inductance body 2a so as to shield the inductance traces 22, 22'. The shielding layers 21a, 21b are free from being electrically connected to the inductance body 2a (or the inductance traces 22, 22'). Referring to FIGS. 2D-1 and 2E, the shielding layers 21a, 21b have a plurality of line segments 210 that are free from being connected to one another. The line segments 210 can have the same or different distances t therebetween.

In an embodiment, the shielding layers 21a, 21b are formed by electroplating, sputtering or physical vapor deposition (PVD), and the line segments 210 are arranged in a radial (as shown in FIGS. 2D-1 and 2E) or multi-ring (as shown in the shielding layer 21a' of FIG. 2D-2) pattern with a circular (as shown in FIGS. 2D-1 and 2E) or polygonal outline. It should be understood that the line segments 210 can have a straight-line shape (as shown in the line segments 210 of FIG. 2D-4 or 2D-5) or a fan shape (as shown in the line segments 210' of FIG. 3C-1 or 3C-2), and can be arranged in a symmetrical pattern (as shown in FIG. 2D-2 or 2D-6) or an asymmetrical pattern (as shown in the shielding layer 21a' of FIG. 2D-3).

Further, the shielding layers 21a, 21b are made of a magnetic conductive material including Fe, Ni, Co, Mn, Zn or an alloy thereof, or other magnetic conductive materials. Furthermore, a magnetic conductive material can be combined with a non-magnetic metal such as copper (Cu) so as to form the shielding layers 21a, 21b. For example, copper is electroplated or chemical plated first and then a magnetic conductive material is plated. Alternatively, a magnetic conductive layer is plated first and then a non-magnetic metal is plated.

Furthermore, the shielding layer 21a can be exposed from the first side 20a of the insulating body 20, and another insulating protective layer 27' is formed on the first side 20a of the insulating body 20 to cover the shielding layer 21a. For example, the insulating protective layer 27' is made of, but not limited to, a dielectric material or a photosensitive or non-photosensitive organic insulating material, such as a solder mask, ABF and EMC. In addition, the insulating protective layers 27, 27' and the insulating body 20 can be made of the same or different materials. When the insulating protective layers 27, 27' and the insulating body 20 are made of the same material, the material combination can be simplified.

In an embodiment, the shielding layer 21a is provided with recessed portions so as to achieve preferred bonding between the shielding layer 21a and the insulating protective layer 27'.

Therefore, a shielding layer 21a, 21b (preferably, two opposite shielding layers 21a, 21b) including a magnetic conductive material is formed on at least one of the two opposite sides of the inductance body 2a (or the multi-layer inductance traces 22, 22') to cover the inductance traces 22, 22', thereby reducing EMI effect, improving the anti-EMI capability and increasing the inductance value and quality factor (or Q value, i.e., ωL/R, wherein ω represents frequency, L represents inductance, and R represents resistance of the inductor). For example, the line segments 210 of the shielding layers 21a, 21b for forming patterns have a line width d that can be adjusted according to the design requirements. The thinner the line width d (as shown in FIG. 2A), the better it is to reduce eddy current.

Further, the magnetic conductive material of the shielding layers 21a, 21b can be selected according to the requirement of the inductance value.

Furthermore, in order to increase the Q value, the electrical conductor 23 can be fabricated by lithography patterning and electroplating a metal post. The shape of the electrical conductor 23 corresponds to the arc shape of the inductance traces 22, 22' so as to achieve a wider electrically conductive area, reduce the resistance R of the inductor and achieve a higher thermal conductivity.

Figure 3A:
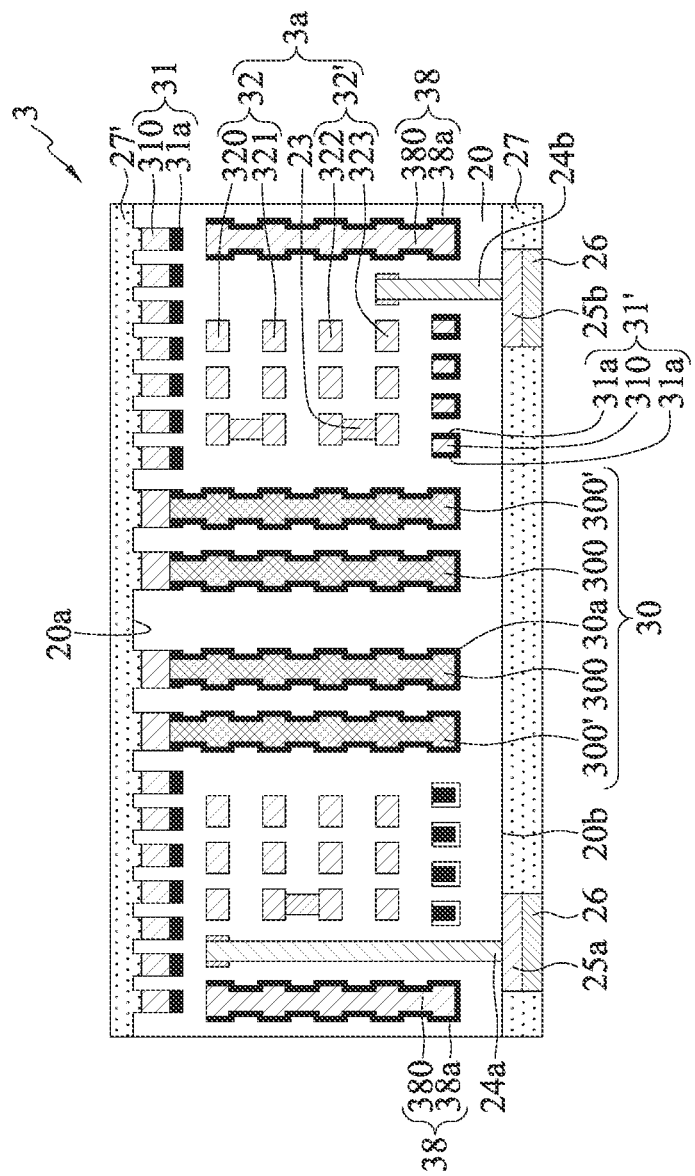
FIG. 3A is a schematic cross-sectional view of an inductance structure according to a second embodiment of the present disclosure.

FIG. 3A is a schematic cross-sectional view of an inductance structure 3 according to a second embodiment of the present disclosure. The second embodiment differs from the first embodiment in addition of a core body.

Referring to FIG. 3A, the inductance structure 3 further has a core body 30 embedded in the insulating body 20 and surrounded by the inductance body 3a. The core body 30 can be connected to the shielding layers 31, 31' (as shown in FIG. 3A) or unconnected to the shielding layers 31, 31' (not shown) according to needs. Further, the core body 30 is free from being contacted with the inductance body 3a.

In an embodiment, the core body 30 has at least a hollow annular electrically conductive post 300, 300' (or a solid electrically conductive post) and a magnetic conductive portion 30a formed on a wall surface of the annular electrically conductive post 300, 300' so as to cause the core body 30 to become a magnetic core element of the inductance structure 3. For example, the annular electrically conductive post 300, 300' is formed by electroplating, sputtering or depositing (or other methods) copper in the insulating body 20, and a magnetic conductive material made of at least one of Fe, Ni, Co, Mn and Zn or a combination thereof is formed on a wall surface of at least one side of the annular electrically conductive post 300, 300' by electroplating, sputtering, deposition or other methods. In an embodiment, the magnetic conductive portion 30a can be formed on the wall surfaces of both sides of the annular electrically conductive post 300, 300' so as to improve the inductance.

Figures 1, 3B:
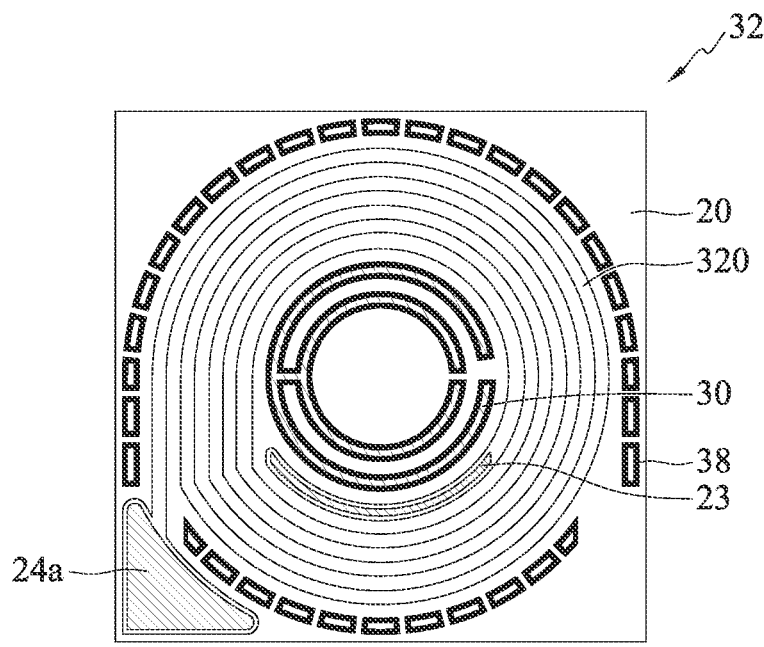
Figures 2, 3B:
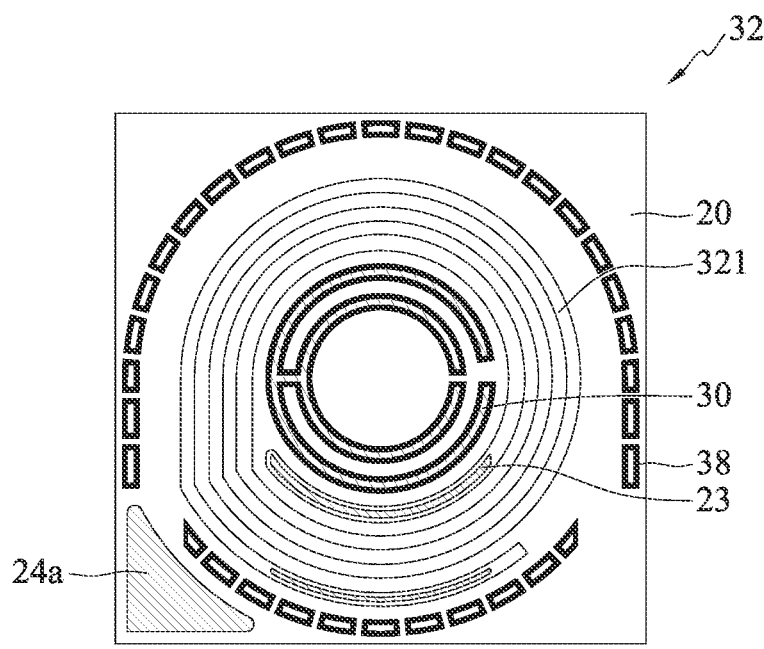
Figures 3, 3B:
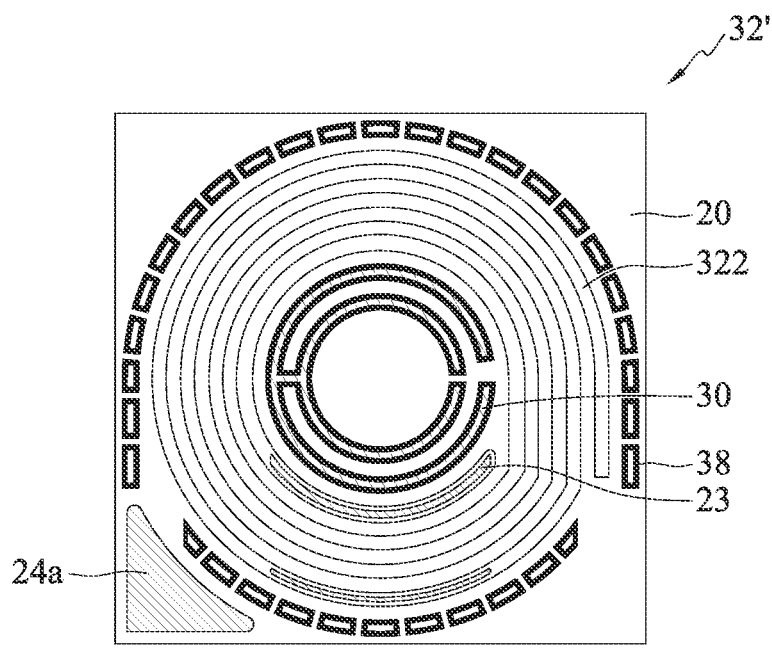
Figures 3, 3B, 4:
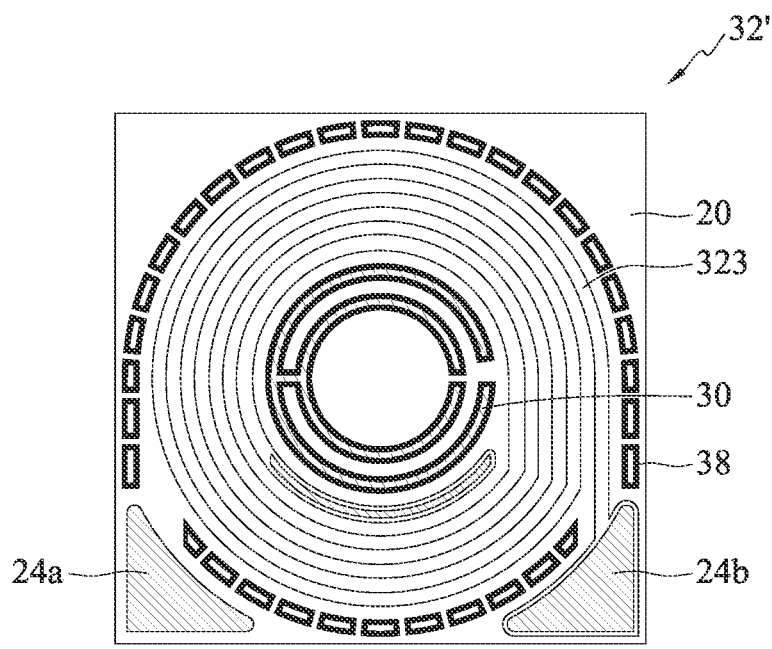
Figures 1, 3C:
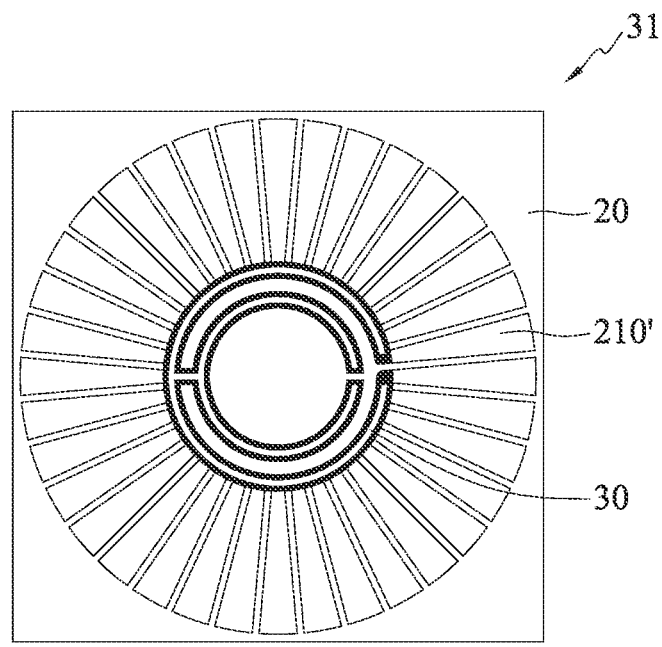
Figures 2, 3C:
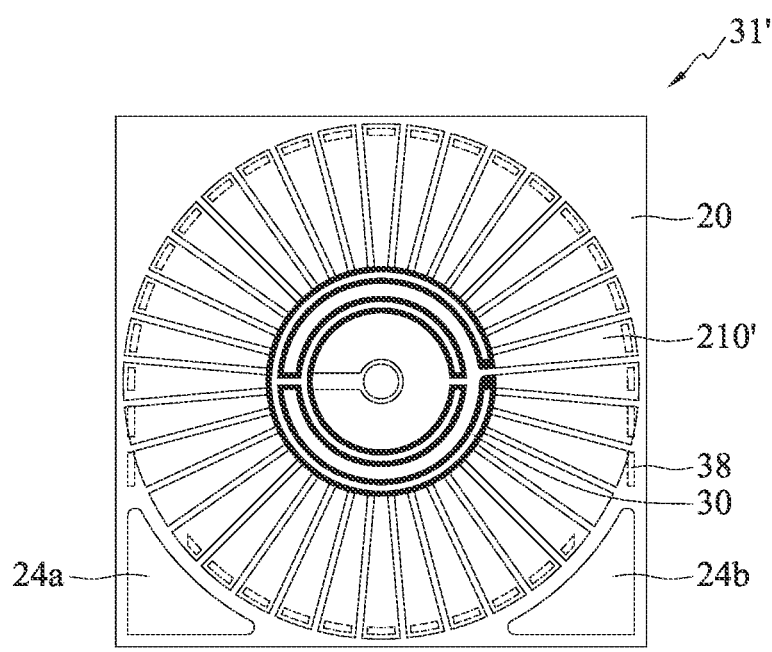

Further, the inductance traces 32, 32' include multi-layer copper spiral coils 320, 321, 322, 323. For example, referring to FIG. 3B-1, the number of turns of the coil of each layer is four. For example, two layers of sheet-shaped coils 321, 322 (four layers of sheet-shaped coils 320, 321, 322, 323 of FIGS. 3B-1 to 3B-4) and one layer of wall-shaped electrical conductor 23 are stacked and connected together.

Furthermore, the configuration of the shielding layer 31, 31' can correspond to the configuration of the core body 30 according to needs. That is, they have the same configuration. For example, the shielding layer 31, 31' has an electrically conductive portion 310 and a magnetic conductive portion 31a formed on the electrically conductive portion 310, and the electrically conductive portion 310 is free from being electrically connected to the inductance traces 32, 32'. Therein, the electrically conductive portion 310 is formed by electroplating, sputtering or depositing (or other methods) a copper layer in the insulating body 20, and the magnetic conductive portion 31a is formed on a surface of at least one side of the electrically conductive portion 310 by electroplating, sputtering or depositing (or other methods) a magnetic conductive material made of at least one of Fe, Ni, Co, Mn and Zn or a combination thereof.

In addition, according to needs, the inductance structure 3 can have such as an annular shielding member 38 embedded in the insulating body 20 for surrounding the inductance body 3a. For example, the configuration of the shielding member 38 can correspond to the configuration of the shielding layer 31, 31' (or the core body 30) according to needs. That is, they have the same configuration. The shielding member 38 has an electrically conductive portion 380 and a magnetic conductive portion 38a formed on the electrically conductive portion 380. The electrically conductive portion 380 is formed by electroplating, sputtering or depositing (or other methods) a copper material in the insulating body 20, and the magnetic conductive portion 38a is formed on a surface of at least one side of the electrically conductive portion 380 by electroplating, sputtering or depositing (or other methods) a magnetic conductive material made of at least one of Fe, Ni, Co, Mn and Zn or a combination thereof.

Therefore, the shielding layer 31, 31' of the inductance structure 3 can have the magnetic conductive portion 31a formed on the patterned copper layer (the electrically conductive portion 310). The core body 30 is arranged in the coils 320, 321, 322 of the inductance traces 32, 32' and has the magnetic conductive portion 30a formed on the surface thereof so as to serve as a magnetic core element, thereby increasing the inductance value of the inductance structure 3.

Further, a magnetic conductive material can be formed on the electrical conductor 23 according to needs so as to improve the electrical characteristics of the inductance structure 3.

Furthermore, the magnetic conductive portions 30a, 31a, 38a are arranged around the inductance traces 32, 32' so as to generate a preferred electromagnetic shielding effect on the inductance body 2a, 3a. Further, a copper material with good electrical conductivity is used as an electrically conductive layer (i.e., the inductance body 3a) so as to achieve a lowest resistance R. Therefore, compared with the inductance structure 2 of the first embodiment, the inductance structure 3 of the second embodiment can achieve better Q value and electrical characteristics.

FIGS. 4A to 4G are schematic cross-sectional views illustrating a method for fabricating an inductance structure according to the present disclosure. The present embodiment is based on the inductance structure 2 of the first embodiment and a method for fabricating a circuit structure through a packaging substrate process is used, for example, a method for fabricating a patterned build-up circuit without a core layer.

Figure 4A:
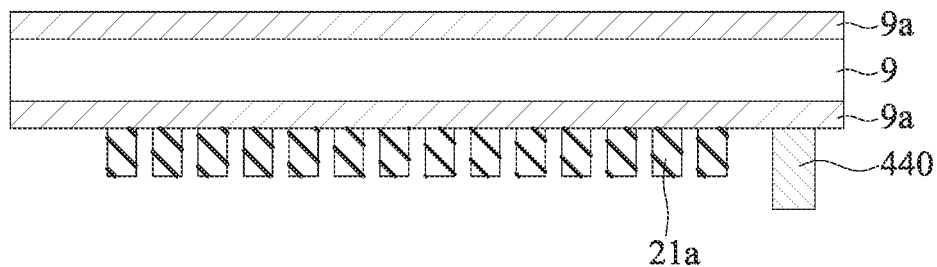
FIGS. 4A to 4G are schematic cross-sectional views illustrating a method for fabricating an inductance structure according to a first embodiment of the present disclosure.

Referring to FIG. 4A, a shielding layer 21a and a copper post body 440 are formed on a carrier 9.

In an embodiment, the carrier 9 is a substrate such as a copper clad substrate, which has a metal material 9a containing copper formed on both sides of the carrier 9, but the present disclosure is not limited to as such.

The shielding layer 21a and the post body 440 are formed by electroplating, sputtering, physical vapor deposition (PVD) or the like.

Figure 4B:
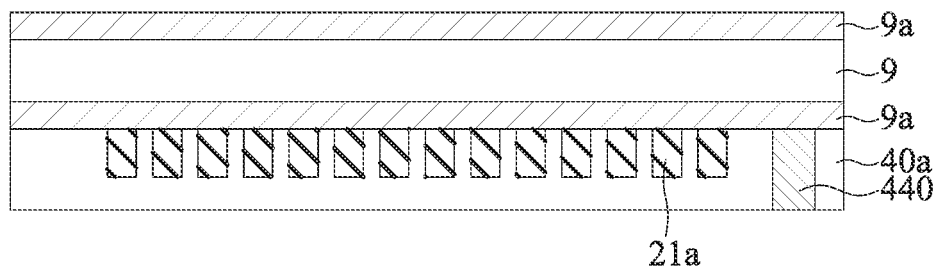

Referring to FIG. 4B, a first insulating layer 40a is formed on the carrier 9 to encapsulate the shielding layer 21a and the post body 440, and the post body 440 is exposed from the first insulating layer 40a, thus completing a single layer patterning process.

Figure 4C:
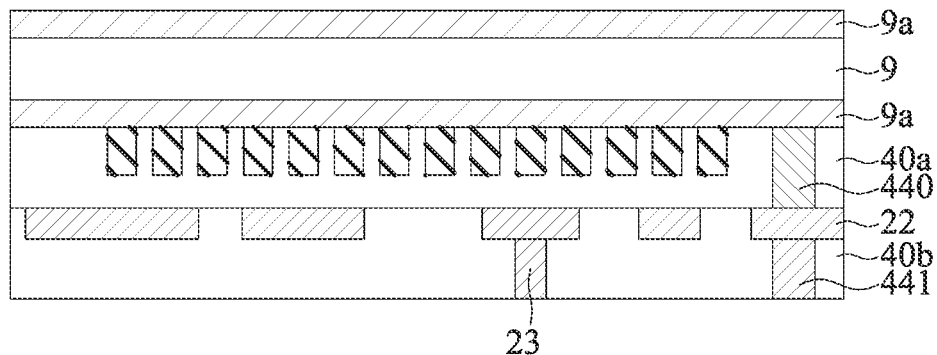

Referring to FIG. 4C, a copper inductance trace 22 is formed on the first insulating layer 40a and contacts the exposed surface of the post body 440. Then, a copper electrical conductor 23 and a copper post body 441 are formed on the inductance trace 22, and the post body 441 corresponds in position to the post body 440. Thereafter, a second insulating layer 40b is formed on the first insulating layer 40a to encapsulate the inductance trace 22, the electrical conductor 23 and the post body 441, and the inductance trace 22, the electrical conductor 23 and the post body 441 are exposed from the second insulating layer 40b, thus completing a single layer patterning process.

In an embodiment, the inductance trace 22, the electrical conductor 23 and the post body 441 can be formed by electroplating, sputtering, PVD or the like.

Figure 4D:
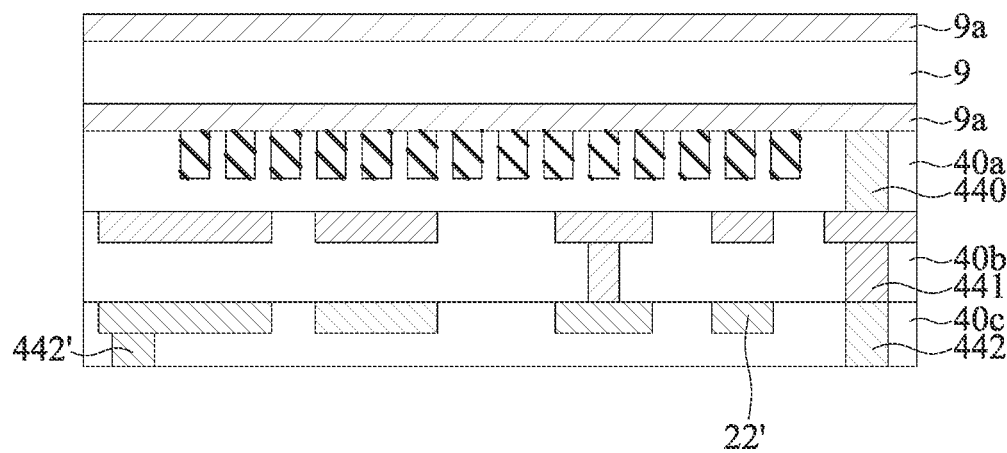

Referring to FIG. 4D, another copper inductance trace 22' is formed on the second insulating layer 40b, and contacts the exposed surface of the electrical conductor 23. Then, a plurality of copper post bodies 442, 442' are formed on the inductance trace 22' and the post body 442 corresponds in position to the post body 441. Thereafter, a third insulating layer 40c is formed on the second insulating layer 40b to encapsulate the inductance trace 22' and the plurality of post bodies 442, 442', and the inductance trace 22' and the plurality of post bodies 442, 442' are exposed from the third insulating layer 40c, thus completing a single layer patterning process.

In an embodiment, the inductance trace 22' and the post bodies 442, 442' can be formed by electroplating, sputtering, PVD or the like.

Figure 4E:
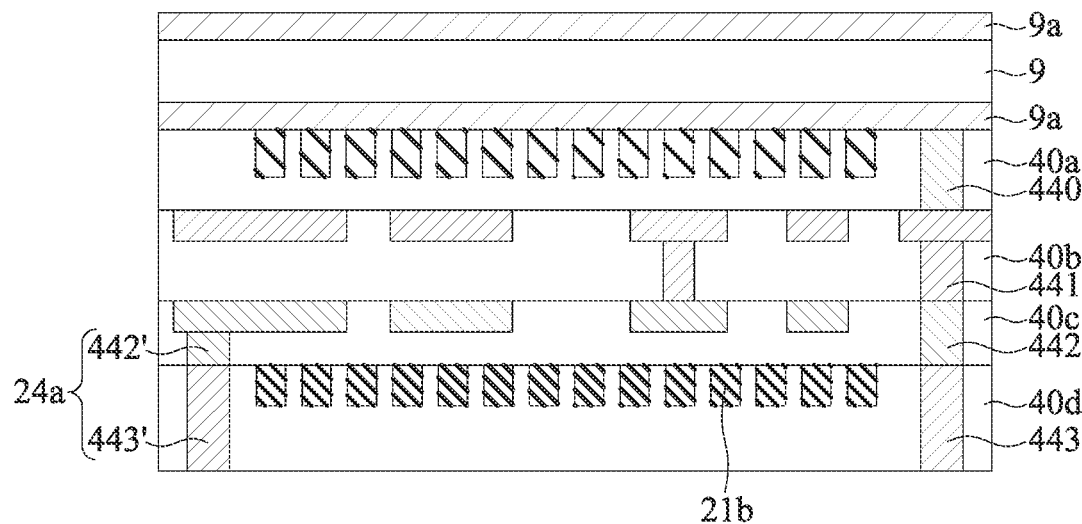

Referring to FIG. 4E, another shielding layer 21b and a plurality of copper post bodies 443, 443' are formed on the third insulating layer 40c. The plurality of post bodies 443, 443' correspond in position to the post bodies 442, 442' and contact the exposed surfaces of the post bodies 442, 442', respectively. As such, the post bodies 442', 443' serve as a first electrically conductive post 24a, and the post bodies 440, 441, 442, 443 serve as a second electrically conductive post 24b. Then, a fourth insulating layer 40d is formed on the third insulating layer 40c to encapsulate the shielding layer 21b and the plurality of post bodies 443, 443'. The first to fourth insulating layers 40a, 40b, 40c, 40d serve as an insulating body 20, and the first and second electrically conductive posts 24a, 24b are exposed from the fourth insulating layer 40d. As such, a single layer patterning process is completed.

In an embodiment, the shield layer 21b and the post bodies 443, 443' can be formed by electroplating, sputtering, PVD or the like.

Figure 4F:
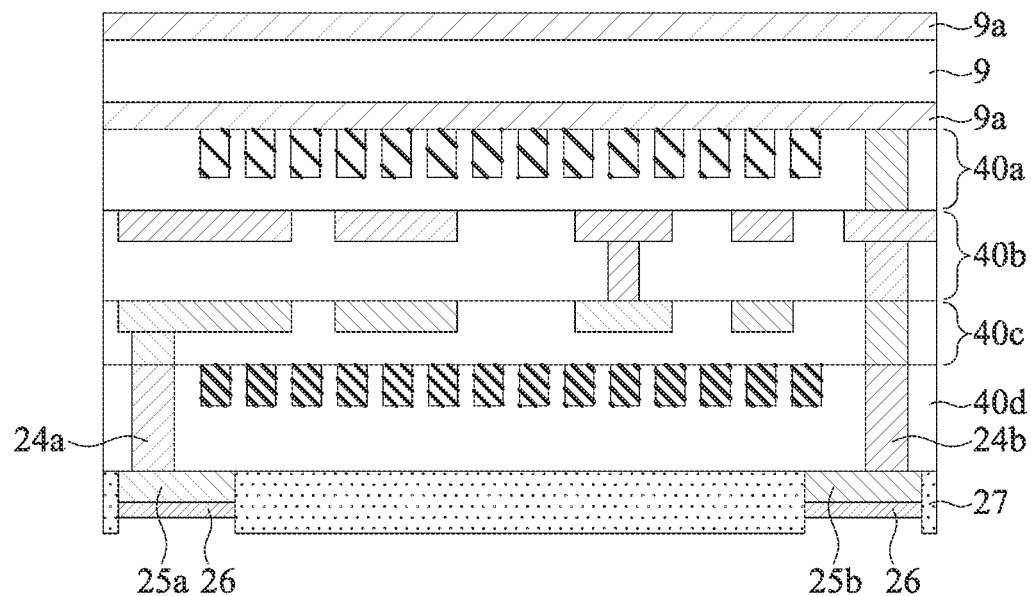

Referring to FIG. 4F, a plurality of copper electrically conductive pads (i.e., first and second electrically conductive pads 25a, 25b) are formed on the fourth insulating layer 40d, and the first and second electrically conductive pads 25a, 25b are connected to the exposed surfaces of the first and second electrically conductive posts 24a, 24b, respectively. Then, an insulating protective layer 27 is formed on the fourth insulating layer 40d, and the first and second electrically conductive pads 25a, 25b are exposed from the insulating protective layer 27 so as to allow a surface processing layer 26 to be formed thereon. As such, a single layer patterning process is completed.

In an embodiment, the first and second electrically conductive pads 25a, 25b can be formed by electroplating, sputtering, PVD, etching or the like.

Figure 4G:
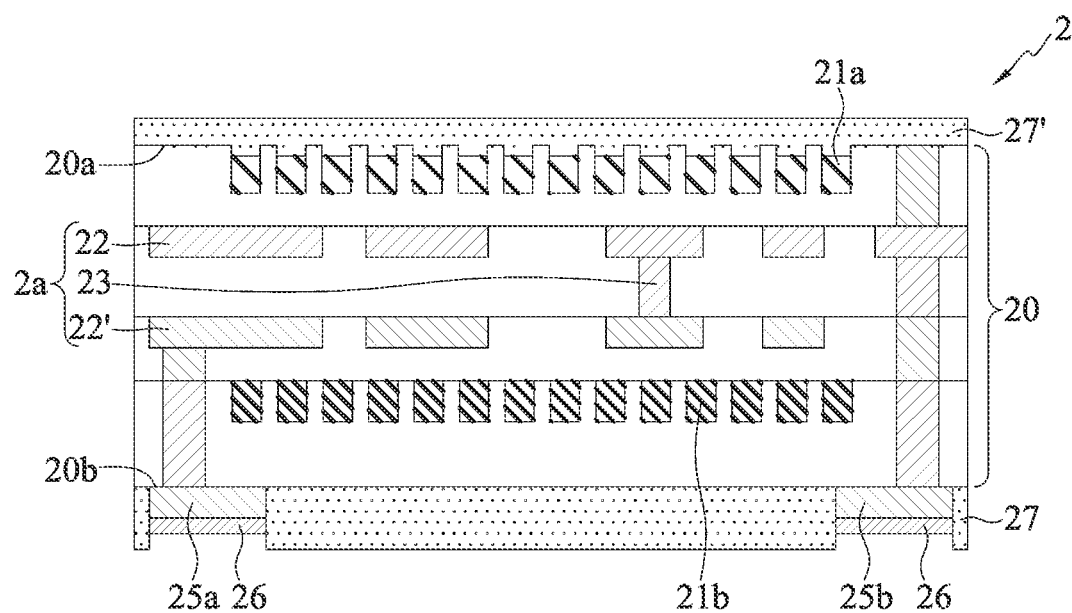

Referring to FIG. 4G, the carrier 9 is removed to expose a first side 20a of the insulating body 20, and then another insulating protective layer 27' is formed on the first side 20a of the insulating body 20 to cover the shielding layer 21a.

In an embodiment, the carrier 9 and the metal material 9a thereof are removed by etching. Therefore, a portion of the shielding layer 21a is slightly etched so as to have a surface slightly lower than the first side 20a of the insulating body 20.

It should be understood that the inductance structure 3 of the second embodiment can be fabricated by using a multi-layer patterning process, and the methods for fabricating the inductance structures 2, 3 can be varied and not limited to the above.

Therefore, the inductance structures 2, 3 of the present disclosure can be fabricated by using a printed circuit board (PCB) or carrier process so as to facilitate large-scale mass production. Further, by using a method for fabricating a patterned build-up circuit without a core layer, a magnetic conductive material is formed by electroplating or deposition. As such, the accuracy of the shielding layer 21a, 21b, 31, 31' can be well controlled. Compared with the prior art, the geometric patterns of the inductance structure 2, 3 of the present disclosure (e.g., the spiral shapes of the inductance traces 22, 32 and the patterns of the shielding layers 21a, 21a', 21a", 21b, 31, 31') have good accuracy, and the accuracy control of the inductance value is excellent.

Further, since a patterned circuit fabrication process can be easily performed by using a magnetic conductive material and an insulating layer (e.g., the first to fourth insulating layers 40a, 40b, 40c, 40d), the inductance structures 2, 3 are advantageous to various designs and applications.

Furthermore, the unconnected line segments 210, 210' of the shielding layers 21a, 21b, 31, 31' improve the magnetic shielding effect and anti-EMI capability and reduce the impact of eddy current and magnetic loss on the Q value.

In addition, compared with the configuration of an iron core block of the prior art, the thickness h of the inductance traces 22, 32 of the inductance structures 2, 3 of the present disclosure can be adjusted according to needs without the configuration of an iron core block, thereby facilitating structure miniaturize so as to meet the miniaturization demand of end products. Compared with the configuration of a magnetic powder dielectric layer of the prior art, the insulating body 20 of the inductance structures 2, 3 of the present disclosure can be easily fabricated without the need to mix with magnetic powder, thereby reducing the fabrication cost and meeting the cost-effective demand of end products.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims

What is claimed is:

1. An inductance structure, comprising:
an insulating body having opposite first and second sides;
a plurality of spiral inductance traces stacked in layers with inter-layer spacings and embedded in the insulating body;
at least one electrical conductor embedded in the insulating body and connecting two adjacent stacked spiral inductance traces of the plurality of spiral inductance traces; and
a plurality of shielding layers embedded in the first and second sides of the insulating body for shielding the plurality of spiral inductance traces, wherein the plurality of shielding layers are free from being electrically connected to the plurality of spiral inductance traces, and wherein the plurality of shielding layers comprise a plurality of line segments that are free from being connected to one another.

2. The inductance structure of claim 1, wherein the insulating body comprises Ajinomoto build-up film, polyimide or epoxy molding compound.

3. The inductance structure of claim 1, further comprising at least one electrically conductive post embedded in the insulating body and electrically connected to an end of at least one of the plurality of spiral inductance traces.

4. The inductance structure of claim 3, further comprising at least one electrically conductive pad formed on the first or second side of the insulating body, wherein the electrically conductive pad is electrically connected to the electrically conductive post and exposed from the insulating body.

5. The inductance structure of claim 4, wherein a cross-sectional shape and an area of the electrically conductive post correspond to a cross-sectional shape and an area of the electrically conductive pad.

6. The inductance structure of claim 1, wherein a shape of the electrical conductor corresponds to shapes of the plurality of spiral inductance traces, and wherein the shape of the electrical conductor is an arc-shaped sheet body or an arc-shaped wall body.

7. The inductance structure of claim 1, wherein the plurality of line segments of the plurality of shielding layers are arranged in a radial, multi-ring or parallel straight line pattern with a circular or polygonal outline.

8. The inductance structure of claim 1, wherein the plurality of shielding layers comprise a magnetic conductive material or a non-magnetic metal, and wherein the magnetic conductive material is at least one of Fe, Ni, Co, Mn and Zn, or a combination thereof.

9. The inductance structure of claim 1, further comprising a magnetic conductive layer formed on portions of surfaces of the plurality of shielding layers, wherein the magnetic conductive layer is made of a magnetic conductive material, and the plurality of shielding layers are made of a non-magnetic metal, and wherein the magnetic conductive material is at least one of Fe, Ni, Co, Mn and Zn, or a combination thereof.

10. The inductance structure of claim 1, further comprising a core body embedded in the insulating body and surrounded by the plurality of spiral inductance traces.

11. The inductance structure of claim 10, wherein the core body comprises at least one annular electrically conductive post or a solid electrically conductive post.

12. The inductance structure of claim 10, wherein the core body comprises a magnetic conductive material or a non-magnetic metal, and wherein the magnetic conductive material is at least one of Fe, Ni, Co, Mn and Zn, or a combination thereof.

13. The inductance structure of claim 10, further comprising a magnetic conductive layer formed on portions of surfaces of the core body, wherein the magnetic conductive layer is made of a magnetic conductive material, and the core body is made of a non-magnetic metal, and wherein the magnetic conductive material is at least one of Fe, Ni, Co, Mn and Zn, or a combination thereof.

14. The inductance structure of claim 1, further comprising a shielding member embedded in the insulating body for surrounding the plurality of spiral inductance traces, wherein the shielding member comprises a plurality of arc-shaped sheet bodies or arc-shaped wall bodies that are arranged in a ring shape.

15. The inductance structure of claim 14, wherein the shielding member comprises a magnetic conductive material or a non-magnetic metal, and wherein the magnetic conductive material is at least one of Fe, Ni, Co, Mn and Zn, or a combination thereof.

16. The inductance structure of claim 14, further comprising a magnetic conductive layer formed on portions of surfaces of the shielding member, wherein the magnetic conductive layer is made of a magnetic conductive material, and the shielding member is made of a non-magnetic metal, and wherein the magnetic conductive material is at least one of Fe, Ni, Co, Mn and Zn, or a combination thereof.

* * * * *